(12) United States Patent
Inubushi et al.

(10) Patent No.: US 11,730,063 B2
(45) Date of Patent: Aug. 15, 2023

(54) MAGNETORESISTIVE EFFECT ELEMENT INCLUDING A HEUSLER ALLOY LAYER WITH A CRYSTAL REGION AND AN AMORPHOUS REGION

(71) Applicant: TDK CORPORATION, Tokyo (JP)

(72) Inventors: Kazuumi Inubushi, Tokyo (JP); Katsuyuki Nakada, Tokyo (JP); Shinto Ichikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 295 days.

(21) Appl. No.: 17/115,283

(22) Filed: Dec. 8, 2020

(65) Prior Publication Data
US 2021/0184103 A1 Jun. 17, 2021

(30) Foreign Application Priority Data

Dec. 17, 2019 (JP) .................................. 2019-227461
Oct. 13, 2020 (JP) .................................. 2020-172690

(51) Int. Cl.
*H10N 50/80* (2023.01)
*H10N 50/01* (2023.01)
*H10N 50/85* (2023.01)

(52) U.S. Cl.
CPC ............. *H10N 50/80* (2023.02); *H10N 50/01* (2023.02); *H10N 50/85* (2023.02)

(58) Field of Classification Search
CPC ........ H01L 43/02; H01L 43/10; H02K 11/215
See application file for complete search history.

(56) References Cited

U.S. PATENT DOCUMENTS

| 9,087,980 | B2 * | 7/2015 | Daibou | ................ H01L 43/08 |
| 2010/0157465 | A1 | 6/2010 | Sakamoto et al. | |
| 2013/0242435 | A1 * | 9/2013 | Fuji | ..................... G11C 11/1659 |
| | | | | 360/324 |
| 2016/0019917 | A1 | 1/2016 | Du et al. | |
| 2019/0109277 | A1 * | 4/2019 | Jan | ......................... H01L 43/10 |

FOREIGN PATENT DOCUMENTS

| JP | 2010-146650 A | 7/2010 |
| JP | 6137577 B2 | 5/2017 |

OTHER PUBLICATIONS

Goripati et al.; "Bi-quadratic interlayer exchange coupling in Co2MnSi/Ag/Co2MnSi pseudo spin-valve"; Journal of Applied Physics; 2011; vol. 110; 123914-1-123914-7.

Furubayashi et al.; "Structure and transport properties of current-perpendicular-to-plane spin valves using Co2FeAl0.5Si0.5 and Co2MnSi Heusler alloy electrodes"; Journal of Applied Physics; 2010; vol. 107; 113917-1-113917-7.

(Continued)

*Primary Examiner* — Thao X Le
*Assistant Examiner* — Daniel Hyun Suh
(74) *Attorney, Agent, or Firm* — Oliff PLC

(57) ABSTRACT

The magnetoresistive effect element includes a first ferromagnetic layer, a second ferromagnetic layer, and a nonmagnetic layer positioned between the first ferromagnetic layer and the second ferromagnetic layer, and at least one of the first ferromagnetic layer and the second ferromagnetic layer includes a Heusler alloy layer including a crystal region and an amorphous region.

17 Claims, 9 Drawing Sheets

(56) References Cited

OTHER PUBLICATIONS

Iwase et al.; "Large Interface Spin-Asymmetry and Magnetoresistance in Fully Epitaxial Co2MnSi/Ag/Co2MnSi Current-Perpendicular-to-Plane Magnetoresistive Devices"; Applied Physics Express; 2009; vol. 2; 063003-1-063003-3.

Jung et al.; "Enhancement of magnetoresistance by inserting thin NiAI layers at the interfaces in Co2FeGa0.5Ge0.5/Ag/Co2FeGa0.5Ge0.5 current-perpendicular-to-plane pseudo spin valves"; 2016; vol. 108; 102408-1-102408-5.

* cited by examiner

MAGNETORESISTIVE EFFECT ELEMENT INCLUDING A HEUSLER ALLOY LAYER WITH A CRYSTAL REGION AND AN AMORPHOUS REGION

CROSS-REFERENCE TO RELATED APPLICATION

This application is based upon and claims the benefit of priority from Japanese Patent Application No. 2019-227461, Dec. 17, 2019 and Japanese Patent Application No. 2020-172690, Oct. 13, 2020 the entire contents of which are incorporated herein by reference.

FIELD

The present invention relates to a magnetoresistive effect element.

BACKGROUND

A magnetoresistive effect element is an element in which a resistance value in a lamination direction changes due to a magnetoresistive effect. A magnetoresistive effect element includes two ferromagnetic layers and a nonmagnetic layer interposed between the ferromagnetic layers. A magnetoresistive effect element in which a conductor is used in a nonmagnetic layer is referred to as a giant magneto-resistance (GMR) element, and a magnetoresistive effect element in which an insulating layer (a tunnel barrier layer, a barrier layer) is used in a nonmagnetic layer is referred to as a tunnel magnetoresistive (TMR) element. A magnetoresistive effect element can be applied to various uses such as a magnetic sensor, a high-frequency component, a magnetic head, and a non-volatile random-access memory (MRAM).

Japanese Unexamined Patent Application, First Publication No. 2010-146650 discloses a magnetic read head that includes a Heusler alloy layer and a Co-based amorphous metal layer. Japanese Unexamined Patent Application, First Publication No. 2010-146650 discloses that a Co-based amorphous metal layer reduces magneto-striction occurring in a magnetoresistive effect element, and discloses that a high MR ratio can be realized by magnetically combining the Heusler alloy layer and the Co-based amorphous metal layer with each other. The magneto-striction is caused by noise of the magnetic read head.

DETAILED DESCRIPTION OF THE INVENTION

Figure 1:
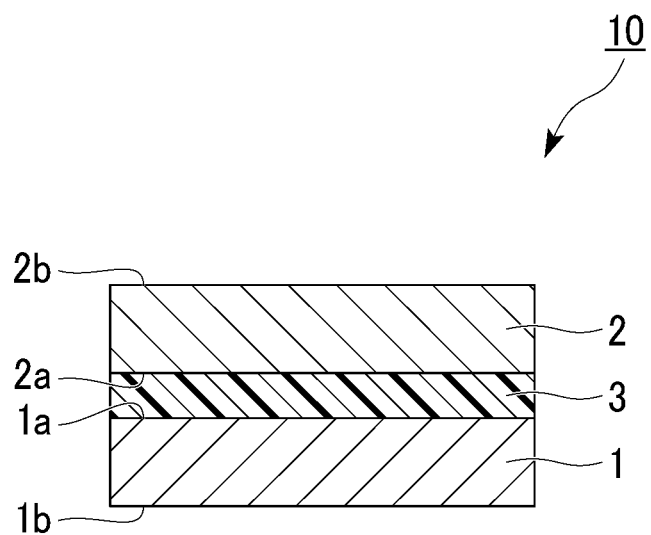
FIG. 1 is a cross-sectional view of a magnetoresistive effect element according to a first embodiment.

In the magnetic read head disclosed in Japanese Unexamined Patent Application, First Publication No. 2010-146650, a magnetization free layer is constituted by two different layers of laminated bodies, that is, a Heusler alloy layer and a Co-based amorphous metal layer. When the different layers are laminated, diffusion of atoms or the like occurs at an interface between the layers. For example, when boron or the like diffuses from another layer to a Heusler alloy, a spin polarizability of the Heusler alloy is reduced, and an MR ratio of the magnetoresistive effect element is reduced.

In order to solve the above-described problems, the present invention provides the following means.

(1) A magnetoresistive effect element according to a first aspect includes a first ferromagnetic layer, a second ferromagnetic layer, and a nonmagnetic layer positioned between the first ferromagnetic layer and the second ferromagnetic layer, and at least one of the first ferromagnetic layer and the second ferromagnetic layer includes a Heusler alloy layer including a crystal region and an amorphous region.

(2) In the magnetoresistive effect element according to the above-described aspect, the Heusler alloy layer may include the crystal region and the amorphous region mixed together.

(3) In the magnetoresistive effect element according to the above-described aspect, a proportion of the crystal region may be higher than a proportion of the amorphous region at a first interface in the Heusler alloy layer which is in contact with the nonmagnetic layer.

(4) In the magnetoresistive effect element according to the above-described aspect, the first interface in the Heusler alloy layer which is in contact with the nonmagnetic layer may be the crystal region.

(5) In the magnetoresistive effect element according to the above-described aspect, the first ferromagnetic layer may be a magnetization fixed layer, the second ferromagnetic layer may be a magnetization free layer, and the second ferromagnetic layer may include the Heusler alloy layer.

(6) In the magnetoresistive effect element according to the above-described aspect, the first ferromagnetic layer may be a magnetization fixed layer, the second ferromagnetic layer may be a magnetization free layer, both the first ferromagnetic layer and the second ferromagnetic layer may include the Heusler alloy layer, and a proportion of the crystal region in the Heusler alloy layer in the first ferromagnetic layer may be higher than that in the Heusler alloy layer in the second ferromagnetic layer.

(7) The magnetoresistive effect element according to the above-described aspect may further include a substrate, and the first ferromagnetic layer may be positioned closer to the substrate than the second ferromagnetic layer.

(8) In the magnetoresistive effect element according to the above-described aspect, the crystal region may include a plurality of crystal grains, and a direction of a crystal axis of at least one crystal grain among the plurality of crystal grains may be different from directions of crystal axes of any of the other crystal grains.

(9) In the magnetoresistive effect element according to the above-described aspect, a proportion of the crystal region at the first interface in the Heusler alloy layer which is in contact with the nonmagnetic layer may be higher than that at a second interface on a side opposite to the first interface.

(10) In the magnetoresistive effect element according to the above-described aspect, a proportion of the crystal region may decrease toward the second interface from the first interface.

(11) In the magnetoresistive effect element according to the above-described aspect, a Heusler alloy constituting the Heusler alloy layer may be represented by $Co_2Y_\alpha Z_\beta$, Y may be one or more kinds of elements selected from the group consisting of Fe, Mn, and Cr, Z may be one or more kinds of elements selected from the group consisting of Si, Al, Ga, and Ge, and $\alpha+\beta>2$ may be satisfied.

(12) The magnetoresistive effect element according to the above-described aspect may further include a third ferromagnetic layer, the third ferromagnetic layer may be in contact with a surface on a side opposite to a surface of the Heusler alloy layer which faces the nonmagnetic layer, the third ferromagnetic layer may include a Co—Fe—B-A alloy, and an A element included in the third ferromagnetic layer may be any one or more elements selected from the group consisting of Ti, V, Cr, Cu, Zn, Zr, Mo, Ru, Pd, Ta, W, Ir, Pt, and Au.

(13) In the magnetoresistive effect element according to the above-described aspect, at least a portion of the third ferromagnetic layer may be crystallized, and at least a portion of a crystal region of the third ferromagnetic layer may be lattice-matched with the crystal region of the Heusler alloy layer.

(14) The magnetoresistive effect element according to the above-described aspect may further include a fourth ferromagnetic layer, the fourth ferromagnetic layer may be positioned between the Heusler alloy layer and the nonmagnetic layer, the fourth ferromagnetic layer may include a Co—Fe—B-A alloy, and an A element included in the fourth ferromagnetic layer may be any one or more elements selected from the group consisting of Ti, V, Cr, Cu, Zn, Zr, Mo, Ru, Pd, Ta, W, Ti, Pt, and Au.

(15) In the magnetoresistive effect element according to the above-described aspect, a film thickness of the fourth ferromagnetic layer may be equal to or less than a spin diffusion length of a material constituting the fourth ferromagnetic layer.

(16) The magnetoresistive effect element according to the above-described aspect may further include a second nonmagnetic layer, the second nonmagnetic layer may be in contact with a surface on a side opposite to a surface of the third ferromagnetic layer which faces the nonmagnetic layer, and the second nonmagnetic layer may include B and any one element selected from the group consisting of Ti, V, Cr, Cu, Zn, Zr, Mo, Ru, Pd, Ta, W, Ir, Pt, and Au.

Hereinafter, the present embodiment will be described in detail with appropriate reference to the drawings. In some cases, in the drawings used in the following description, characteristic portions are illustrated at an enlarged scale for convenience of easy understanding of characteristics, and the dimensional ratios and the like of the respective components are not necessarily the same as the actual ones. In the following description, materials, dimensions, and the like are merely exemplary, do not limit the present invention, and can be appropriately modified within a range not departing from the scope of the present invention.

First Embodiment

FIG. 1 is a cross-sectional view of a magnetoresistive effect element according to a first embodiment. First, directions will be defined. A direction in which layers are laminated may be referred to as a lamination direction. In addition, a direction which intersects a lamination direction and in which layers expand may be referred to as an in-plane direction.

A magnetoresistive effect element 10 illustrated in FIG. 1 includes a first ferromagnetic layer 1, a second ferromagnetic layer 2, and a nonmagnetic layer 3. The nonmagnetic layer 3 is positioned between the first ferromagnetic layer 1 and the second ferromagnetic layer 2. Hereinafter, the first ferromagnetic layer 1 and the second ferromagnetic layer 2 may be referred to simply as a ferromagnetic layer in a case where the ferromagnetic layers are not distinguished from each other.

The magnetoresistive effect element 10 outputs a resistance value. The resistance value changes according to the change in a relative angle between magnetization of the first ferromagnetic layer 1 and magnetization of the second ferromagnetic layer 2. The magnetization of the second ferromagnetic layer 2 may be more likely to move than, for example, the magnetization of the first ferromagnetic layer 1. In a case where a predetermined external force is applied, the direction of the magnetization of the first ferromagnetic layer 1 does not change (is fixed), and the direction of the magnetization of the second ferromagnetic layer 2 changes. The direction of the magnetization of the second ferromagnetic layer 2 changes with respect to the direction of the magnetization of the first ferromagnetic layer 1, and thus a resistance value of the magnetoresistive effect element 10 changes. In this case, the first ferromagnetic layer 1 may be referred to as a magnetization fixed layer, and the second ferromagnetic layer 2 may be referred to as a magnetization free layer. It is preferable that the first ferromagnetic layer 1 be positioned closer to a substrate side serving as the base than the second ferromagnetic layer 2 in order to increase stability of magnetization.

Hereinafter, description will be given on the assumption that the first ferromagnetic layer 1 is a magnetization fixed layer and the second ferromagnetic layer 2 is a magnetization free layer, but this relationship may be reversed. In addition, the magnetoresistive effect element 10 outputs a change in a relative angle between the magnetization of the first ferromagnetic layer 1 and the magnetization of the second ferromagnetic layer 2 as a resistance value change, and thus a configuration in which both the magnetization of the first ferromagnetic layer 1 and the magnetization of the second ferromagnetic layer 2 move (that is, both the first ferromagnetic layer 1 and the second ferromagnetic layer 2 are magnetization free layers) may be adopted.

A difference in mobility between the magnetization of the first ferromagnetic layer 1 and the magnetization of the second ferromagnetic layer 2 at the time of applying a predetermined external force occurs due to a difference in a coercive force between the first ferromagnetic layer 1 and the second ferromagnetic layer 2. For example, when the thickness of the second ferromagnetic layer 2 is made smaller than the thickness of the first ferromagnetic layer 1, the coercive force of the second ferromagnetic layer 2 becomes smaller than the coercive force of the first ferromagnetic layer 1. In addition, for example, an antiferromagnetic layer may be provided on a surface of the first ferromagnetic layer 1 on a side opposite to the nonmagnetic layer 3 through a spacer layer. The first ferromagnetic layer 1, the spacer layer, and the antiferromagnetic layer is a synthetic antiferromagnetic structure (SAF structure). The synthetic antiferromagnetic structure is constituted by two magnetic layers having a spacer layer interposed therebetween. The first ferromagnetic layer 1 and the antiferromagnetic layer are coupled to each other in an antiferromagnetic coupling manner, and thus the coercive force of the first ferromagnetic layer 1 becomes larger than in a case where the antiferromagnetic layer is not provided. The antiferromagnetic layer is, for example, IrMn, PtMn, or the like. The spacer layer contains at least one selected from the group consisting of, for example, Ru, Ir, and Rh.

The first ferromagnetic layer 1 and the second ferromagnetic layer 2 include a ferromagnetic material respectively. The first ferromagnetic layer 1 of the magnetoresistive effect element 10 illustrated in FIG. 1 contains, for example, a metal selected from the group consisting of Cr, Mn, Co, Fe, and Ni, an alloy containing one or more of these metals, and an alloy containing these metals and at least one type of element among B, C, and N. For example, the first ferromagnetic layer 1 is Co—Fe or Co—Fe—B. The first ferromagnetic layer 1 may be constituted by a Heusler alloy.

The magnetoresistive effect element 10 illustrated in FIG. 1 includes a Heusler alloy layer in which the second ferromagnetic layer 2 (magnetization free layer) contains a Heusler alloy. The Heusler alloy layer is constituted by, for example, a Heusler alloy. In addition, the second ferromagnetic layer 2 is constituted by, for example, a Heusler alloy layer.

A Heusler alloy is an intermetallic compound having a chemical composition of XYZ or $X_2YZ$. A ferromagnetic Heusler alloy represented by $X_2YZ$ is referred to as a full Heusler alloy, and a ferromagnetic Heusler alloy represented by XYZ is referred to as a half Heusler alloy. A half Heusler alloy is an alloy in which some X-site atoms of the full Heusler alloy are formed as an empty lattice. They are typically intermetallic compounds based on a bcc structure.

FIG. 2 is an example of a crystal structure of a Heusler alloy. FIG. 2A, FIG. 2B and FIG. 2C are examples of a crystal structure of a full Heusler alloy, and FIG. 2D, FIG. 2E and FIG. 2F are examples of a crystal structure of a half Heusler alloy.

Figure 2A:
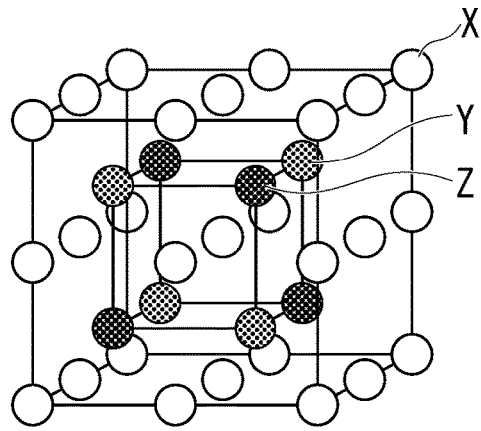
FIG. 2A is a diagram illustrating a crystal structure of a Heusler alloy.

FIG. 2A is referred to as an $L2_1$ structure. In the $L2_1$ structure, elements entering an X site, elements entering a Y site, and elements entering a Z site are fixed. FIG. 2B is referred to as a B2 structure derived from the $L2_1$ structure. In the B2 structure, elements entering a Y site and elements entering a Z site are mixed together, and elements entering an X site are fixed. FIG. 2C is referred to as an A2 structure derived from the $L2_1$ structure. In the A2 structure, elements entering an X site, elements entering a Y site, and elements entering a Z site are mixed together.

Figure 2D:
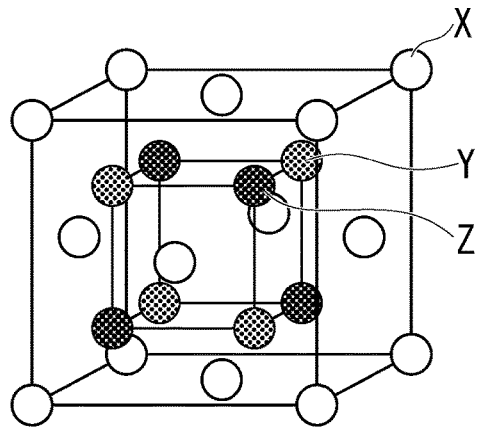
FIG. 2D is a diagram illustrating a crystal structure of a Heusler alloy.
Figure 2B:
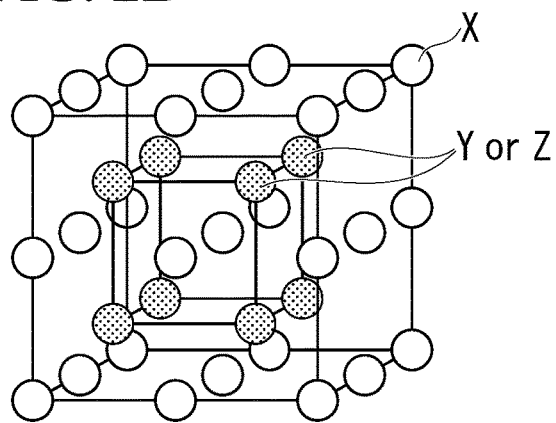
FIG. 2B is a diagram illustrating a crystal structure of a Heusler alloy.
Figure 2E:
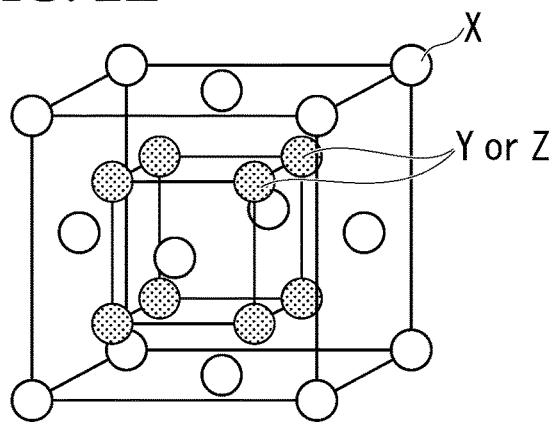
FIG. 2E is a diagram illustrating a crystal structure of a Heusler alloy.
Figure 2C:
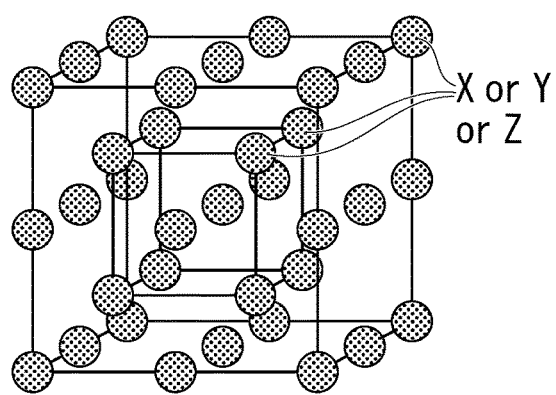
FIG. 2C is a diagram illustrating a crystal structure of a Heusler alloy.
Figure 2F:
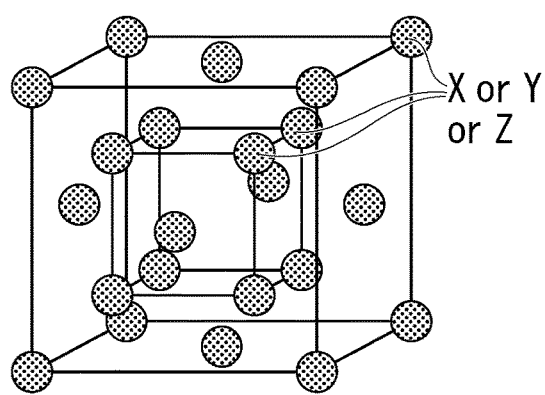
FIG. 2F is a diagram illustrating a crystal structure of a Heusler alloy.

FIG. 2D is referred to as a $C1_b$ structure. In the $C1_b$ structure, elements entering an X site, elements entering a Y site, and, and elements entering a Z site are fixed. FIG. 2E is referred to as a B2 structure derived from the $C1_b$ structure. In the B2 structure, elements entering a Y site and elements entering a Z site are mixed together, and elements entering an X site are fixed. FIG. 2F is referred to as an A2 structure derived from the $C1_b$ structure. In the A2 structure, elements entering an X site, elements entering a Y site, and elements entering a Z site are mixed with each other.

Among the full Heusler alloys, crystallinity becomes higher in the order of the $L2_1$ structure>the B2 structure>the A2 structure. Among the half Heusler alloys, crystallinity becomes higher in the order of the $C1_b$ structure>the B2 structure>the A2 structure. These crystal structures differ in the degree of crystallinity, but all of them are crystal. In an amorphous Heusler alloy, none of the above-described crystal structures is confirmed, but a stoichiometric composition formula satisfies XYZ or $X_2YZ$.

Here, in the periodic table, X is a transition metal element of a Co, Fe, Ni, or Cu group or a noble metal element, Y is a transition metal of a Mn, V, Cr, or Ti group or an elemental species of X, and Z is a typical element of groups III to V. The full Heusler alloy is, for example, $Co_2FeSi$, $Co_2FeGe$, $Co_2FeGa$, $Co_2FeAl$, $Co_2FeGe_xGa_{1-x}$, $Co_2MnGe_xGa_{1-x}$, $Co_2MnSi$, $Co_2MnGe$, $Co_2MnGa$, $Co_2MnSn$, $Co_2MnAl$, $Co_2CrAl$, $Co_2VAl$, $Co_2Mn_{1-a}Fe_aAl_bSi_{1-b}$, or the like. The half Heusler alloy is, for example, NiMnSe, NiMnTe, NiMnSb, PtMnSb, PdMnSb, CoFeSb, NiFeSb, RhMnSb, CoMnSb, IrMnSb, or NiCrSb.

A Heusler alloy contained in a Heusler alloy layer is represented by, for example, $Co_2Y_\alpha Z_\beta$. Y is one or more types of elements selected from the group consisting of, for example, Fe, Mn, and Cr, and Z is one or more types of elements selected from the group consisting of, for example, Si, Al, Ga, and Ge and satisfies $\alpha+\beta>2$. Fe is particularly preferable for Y. In addition, for $\alpha$, for example, $0.5<\alpha<1.9$, preferably $0.8<\alpha<1.33$, and more preferably $0.9<\alpha<1.2$. In addition, for $\beta$, for example, $\alpha<\beta<2\alpha$ and $\alpha<\beta<1.5\alpha$.

A full Heusler alloy having a stoichiometric composition is represented by $Co_2YZ$. When $\alpha+\beta>2$ is satisfied, a Co composition ratio in the Heusler alloy becomes relatively small. When the Co composition ratio becomes relatively small, it is possible to avoid an antisite in which an element of a Y site is replaced with an element of an X site (a site containing Co). The antisite varies the Fermi level of a Heusler alloy. When the Fermi level varies, a half metal property of the Heusler alloy deteriorates, and spin polarizability deteriorates. The deterioration in the spin polarizability is caused by a decrease in an MR ratio of the magnetoresistive effect element 10.

In addition, it is further preferable to satisfy $\alpha+\beta>2.3$. By satisfying $\alpha+\beta>2.3$, a Co composition ratio in the Heusler alloy becomes relatively small. When the Co composition ratio becomes relatively small, it is further possible to avoid an antisite in which the element of the Y site is replaced with an element of an X site (a site containing Co). The antisite varies the Fermi level of a Heusler alloy. When the Fermi level varies, a half metal property of the Heusler alloy deteriorates, and a spin polarizability deteriorates. The deterioration in the spin polarizability is caused by a decrease in an MR ratio of the magnetoresistive effect element 10.

A Heusler alloy layer includes a crystal region and an amorphous region. In the Heusler alloy layer, for example, the crystal region and the amorphous region are mixed with each other. The crystal region and the amorphous region may be partially present in a layered form. In the Heusler alloy layer, the crystal region may be scattered in the amorphous region, or the amorphous region may be scattered in the crystal region.

The crystal region is a region having a crystal structure in which atoms are regularly arranged. The amorphous region is a region in which regular arrangement of atoms is not confirmed. The crystal region may be constituted by, for example, a plurality of crystal grains. The direction of a crystal axis of at least one crystal grain among the plurality of crystal grains is different from, for example, the directions of crystal axes of any of the other crystal grains. In addition, for example, the directions of the respective crystal axes of the plurality of crystal grains may be different from each other. Since grain boundary resistance is generated at a crystal grain boundary, a resistance value of the entire Heusler alloy layer increases when the crystal region is constituted by the plurality of crystal grains. When the resistance of a ferromagnetic layer increases, an MR ratio of a magnetoresistive effect element becomes larger.

Whether or not a Heusler alloy is crystallized can be determined from a transmission electron microscope (TEM) image (for example, a high-angle annular dark-field scanning transmission electron microscope image: HAADF-STEM image) or an electron beam diffraction image using a transmission electron beam. When a Heusler alloy is crystallized, for example, a state where atoms are regularly arranged in a HAADF-STEM image captured by a TEM can be confirmed. In more detail, spots derived from a crystal structure of the Heusler alloy appear in a Fourier transform image of the HAADF-STEM image. In addition, when a Heusler alloy is crystallized, it is possible to confirm a diffraction spot from at least one surface among a (001) surface, a (002) surface, a (110) surface, and a (111) surface in the electron beam diffraction image. In a case where crystallization can be confirmed by at least any one means, it can be said that at least a portion of the Heusler alloy is crystallized.

In addition, the crystal structure of the Heusler alloy can be measured by an X-ray diffraction method (XRD), a reflection high-energy electron diffraction method (RHEED), or the like. For example, in the case of XRD, when the Heusler alloy has an $L2_1$ structure, peaks (200) and (111) are shown, and when the Heusler alloy has a B2 structure, the peak (200) is shown and the peak (111) is not shown. For example, in the case of the RHEED, when the Heusler alloy has an $L2_1$ structure, a streak (200) and a streak (111) are shown, and when the Heusler alloy has a B2 structure, the streak (200) is shown and a streak (111) is not shown Composition analysis of layers constituting the magnetoresistive effect element can be performed using energy dispersive X-ray spectroscopy (EDS). In addition, when EDS is performed, for example, composition distribution of each material in a film thickness direction can be confirmed.

In addition, the composition of a Heusler alloy can be measured by X-ray fluorescence (XRF), inductively coupled plasma (ICP) emission spectroscopy, secondary ion mass spectrometry (SIMS), Auger electron spectroscopy (AES), or the like.

When the Heusler alloy layer includes an amorphous region, magneto-striction occurring in the ferromagnetic layer is reduced. The magneto-striction is a phenomenon in which distortion occurs in a shape due to a change in magnetization of a ferromagnetic body. The magneto-striction occurs due to a change in elastic energy caused by a change in an interaction between spins occurring due to a change in the direction of magnetization. The magneto-striction generally becomes larger as crystallinity becomes higher. The amorphous region alleviates magneto-striction, and thus magneto-striction of the entire Heusler alloy layer is reduced.

The Heusler alloy layer is in contact with the nonmagnetic layer 3. Hereinafter, the surface of the Heusler alloy layer which is in contact with the nonmagnetic layer 3 is referred to as a first interface, and a surface on a side opposite to the first interface is referred to as a second interface. In a case where the second ferromagnetic layer 2 is constituted by the Heusler alloy layer, a first surface 2a of the second ferromagnetic layer 2 is a first interface, and a second surface 2b is a second interface.

The first interface may be configured such that, for example, the proportion of a crystal region is higher than the proportion of an amorphous region and may be constituted by a crystal region. The proportion of the crystal region to the amorphous region in the first interface is determined from a TEM image of a cross-section obtained by cutting off the magnetoresistive effect element 10 along a lamination direction. Specifically, the determination is performed according to the following procedure. First, the magnetoresistive effect element 10 is cut off at any 10 positions, and a TEM image at each of the positions in the first interface is obtained. In each of the TEM images, the proportion of the crystal region to the amorphous region is obtained in accordance with the above-described standard for determination. In a case where the proportion of the crystal region is higher than the proportion of the amorphous region in 6 or more TEM images among the 10 TEM images, the proportion of the crystal region in the first interface is regarded as being higher than the proportion of the amorphous region. Further, in a case where only a crystal region is confirmed in the first interface in all of the 10 TEM images, the first interface is regarded as being constituted by a crystal region.

When the proportion of the crystal region increases in the first interface, an MR ratio of the magnetoresistive effect element 10 is improved. The MR ratio of the magnetoresistive effect element 10 is improved when spin polarizabilities of the first ferromagnetic layer 1 and the second ferromagnetic layer 2 are high. A Heusler alloy has a feature of having high spin polarizability. As the crystallinity of a Heusler alloy becomes higher, the Heusler alloy has higher spin polarizability close to a theoretical value. When the crystallinity at the first interface adjacent to the nonmagnetic layer 3 is high, high spin polarizability of the Heusler alloy is maintained at the first interface, and the MR ratio of the magnetoresistive effect element 10 is improved.

In addition, a resistance value of the crystal region is smaller than a resistance value of the amorphous region. A read current for measuring the MR ratio of the magnetoresistive effect element 10 flows in the lamination direction of the magnetoresistive effect element 10. In a case where the proportion of the crystal region is higher than the proportion of the amorphous region, the read current concentrates on a crystal region having high spin polarizability in the first interface, and thus the MR ratio of the magnetoresistive effect element 10 which is output increases.

In addition, for example, the first interface has a higher proportion of a crystal region than that of the second interface. For example, the proportion of the crystal region decreases toward the second interface from the first interface. The magnetoresistive effect element 10 outputs a difference in a relative angle of magnetization between two ferromagnetic layers with the nonmagnetic layer 3 interposed therebetween as a resistance value. The influence of a change in magnetization at the first interface which is in contact with the nonmagnetic layer 3 on the MR ratio of the magnetoresistive effect element is greater than that of a change in magnetization at the second interface which is distant from the nonmagnetic layer 3. The magnetoresistive effect element 10 having a high crystallinity at the first interface which is in contact with the nonmagnetic layer has high spin polarizability and a large MR ratio in the vicinity of a Fermi surface.

The proportion of the crystal region at the first interface is an average value of the proportion of the crystal region at the first interface of each of the above-described 10 TEM images, and the proportion of the crystal region at the second interface is an average value of the proportion of the crystal region at the second interface of each of the above-described 10 TEM images.

The nonmagnetic layer 3 is formed of, for example, a nonmagnetic metal. The nonmagnetic layer 3 is a metal or an alloy containing any one element selected from the group consisting of, for example, Cu, Au, Ag, Al, and Cr. The nonmagnetic layer 3 contains, for example, any one element selected from the group consisting of Cu, Au, Ag, Al, and Cr as main constituent elements. The main constituent elements mean that the proportion of Cu, Au, Ag, Al, and Cr is 50% or higher. It is preferable that the nonmagnetic layer 3 contain Ag and include Ag as a main constituent element. Since Ag has a long spin diffusion length, the magnetoresistive effect element 10 using Ag shows a large MR ratio.

The thickness of the nonmagnetic layer 3 is within a range between, for example, 1 nm or more and 10 nm or less. The nonmagnetic layer 3 disturbs magnetic coupling between the first ferromagnetic layer 1 and the second ferromagnetic layer 2.

The nonmagnetic layer 3 may be an insulator or a semiconductor. A nonmagnetic insulator is a material in which, for example, $Al_2O_3$, $SiO_2$, MgO, $MgAl_2O_4$, and some of Al, Si, and Mg thereof are substituted for Zn, Be, and the like. These materials have a large bandgap and excellent insulating properties. In a case where the nonmagnetic layer 3 is constituted by a nonmagnetic insulator, the nonmagnetic layer 3 is a tunnel barrier layer. A nonmagnetic semiconductor is, for example, Si, Ge, $CuInSe_2$, $CuGaSe_2$, Cu (In, Ga) $Se_2$, or the like.

Figure 3:
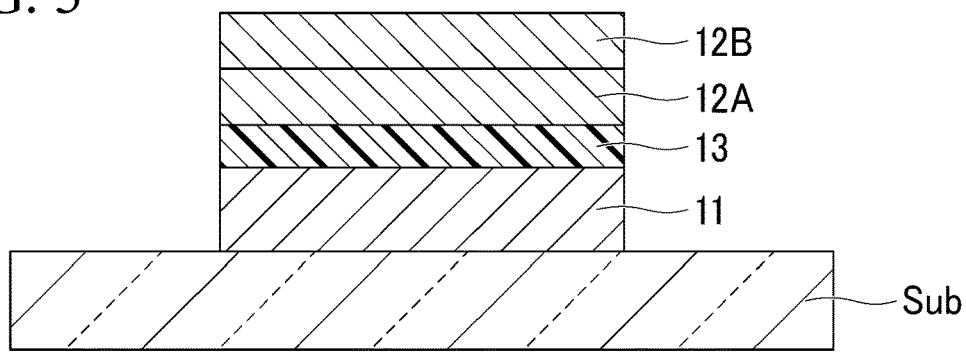
FIG. 3 is a cross-sectional view illustrating a method of manufacturing a magnetoresistive effect element according to the first embodiment.

Next, a method of manufacturing the magnetoresistive effect element 10 will be described. FIG. 3 is a schematic diagram illustrating a method of manufacturing the magnetoresistive effect element 10 according to the first embodiment. First, a substrate serving as a base for film formation is prepared. The substrate may have crystallinity or may be an amorphous substrate. Examples of the substrate having crystallinity include metal oxide single crystal, silicon single crystal, sapphire single crystal, and ceramic. Examples of the amorphous substrate include silicon single crystal with a thermal oxide film, glass, and quartz.

Subsequently, a ferromagnetic layer 11 is formed on the substrate. The ferromagnetic layer 11 is formed by, for example, a sputtering method. The ferromagnetic layer 11 is formed of the same material as the first ferromagnetic layer 1. The ferromagnetic layer 11 is annealed after the film formation. Hereinafter, the annealing of the ferromagnetic layer 11 will be referred to as first annealing. The ferromagnetic layer 11 is crystallized through the first annealing, thereby forming the first ferromagnetic layer 1. The temperature of the first annealing is, for example, higher than 300° C.

Subsequently, a nonmagnetic layer 13 and a ferromagnetic layer 12A are formed on the ferromagnetic layer 11. The ferromagnetic layer 12A is annealed after the film formation. Hereinafter, the annealing of the ferromagnetic layer 12A will be referred to as second annealing. The temperature of the second annealing is lower than the temperature of the first annealing. The temperature of the second annealing is, for example, 300° C. A portion of the ferromagnetic layer 12A is crystallized through the second annealing. The temperature of the second annealing is lower than the temperature of the first annealing, and thus an uncrystallized amorphous region remains in the ferromagnetic layer 12A.

Subsequently, a ferromagnetic layer 12B is formed on the ferromagnetic layer 12A. The ferromagnetic layer 12B is annealed after the film formation. Hereinafter, the annealing of the ferromagnetic layer 12B will be referred to as third annealing. The temperature of the third annealing is lower than the temperature of the second annealing. The temperature of the third annealing is, for example, equal to or higher than 200° C. and less than 300° C. and is, for example, 250° C. A portion of the ferromagnetic layer 12B is crystallized through the third annealing. The temperature of the third annealing is lower than the temperature of the second annealing, and the crystallinity of the ferromagnetic layer 12B is lower than the crystallinity of the ferromagnetic layer 12A.

According to the above-described procedure, the ferromagnetic layer 11 is formed as the first ferromagnetic layer 1, the nonmagnetic layer 13 is formed as the nonmagnetic layer 3, and the ferromagnetic layer 12A and the ferromagnetic layer 12B are formed as the second ferromagnetic layer 2, whereby the magnetoresistive effect element 10 is manufactured. The crystallinity of the ferromagnetic layer 12A is higher than the crystallinity of the ferromagnetic layer 12B, and the proportion of a crystal region at the first interface becomes higher than that at the second interface. In addition, the proportion of the crystal region at the first interface can be freely controlled according to the temperature of the second annealing.

In the magnetoresistive effect element 10 according to the present embodiment, the second ferromagnetic layer 2 includes a Heusler alloy layer including an amorphous region, and thus magneto-striction can be reduced. The magneto-striction results in noise of a magnetic sensor. Thus, according to the magnetoresistive effect element 10 of the present embodiment, it is possible to obtain a magnetic sensor having high sensitivity. Further, in the second ferromagnetic layer 2, an amorphous region is included in a Heusler alloy layer, and thus infiltration of atoms from other layers due to diffusion is prevented by annealing during manufacture, or the like. The diffusion of atoms from other layers results in a deterioration in spin polarizability of a Heusler alloy. In the magnetoresistive effect element 10 according to the present embodiment, a Heusler alloy layer has a high spin polarizability and a large MR ratio.

Although an embodiment of the present invention has been described in detail with reference to the drawings, the configurations, combinations thereof, and the like in the embodiment are examples, and addition, omission, substitution, and other changes can be made to the configurations without departing from the scope of the invention.

In the above-described magnetoresistive effect element, a case where only the second ferromagnetic layer 2 includes a Heusler alloy layer has been described as an example, but the first ferromagnetic layer 1 may include a Heusler alloy layer. In a case where the first ferromagnetic layer 1 is constituted by a Heusler alloy layer, a first surface 1a of the first ferromagnetic layer 1 is a first interface, and a second surface 1b is a second interface. The first surface 1a is a surface of the first ferromagnetic layer 1 on the nonmagnetic layer 3 side, and the second surface 1b is a surface of the first ferromagnetic layer 1 on a side opposite to the first surface 1a.

In a magnetization free layer (second ferromagnetic layer 2) of which the magnetization direction changes, magneto-striction is likely to occur. On the other hand, in a magnetization fixed layer (first ferromagnetic layer 1) of which the magnetization direction does not change easily, magneto-striction is not likely to occur. However, even in the magnetization fixed layer, it does not mean that magneto-striction does not occur at all. Accordingly, the first ferromagnetic layer 1 includes a Heusler alloy layer, and thus the magneto-striction of the magnetoresistive effect element 10 is reduced.

In addition, both the first ferromagnetic layer 1 and the second ferromagnetic layer 2 may include a Heusler alloy layer. In this case, in the Heusler alloy layer in the first ferromagnetic layer 1 (the magnetization fixed layer in the present embodiment), it is preferable that, for example, the proportion of a crystal region be higher than that in the Heusler alloy layer in the second ferromagnetic layer (the magnetization free layer in the present embodiment). In the magnetization fixed layer, the direction of magnetization does not change, and thus magneto-striction is not likely to occur. On the other hand, in the magnetization free layer, the direction of magnetization changes, and thus magneto-striction is likely to occur. The proportion of an amorphous region of a Heusler alloy layer in the magnetization free layer in which magneto-striction is likely to occur is large, and thus it is possible to efficiently alleviate magneto-striction in the amorphous region and to reduce magneto-striction in the entire magnetoresistive effect element 10.

In a case where the first ferromagnetic layer 1 includes a Heusler alloy layer, it is possible to form an amorphous region in the first ferromagnetic layer 1 by setting the temperature of first annealing to a low temperature. In addition, it is possible to increase the proportion of a crystal region at the first interface of the first ferromagnetic layer 1 by forming the ferromagnetic layer 11 and then irradiating the surface of the ferromagnetic layer with a laser or the like.

Figure 4:
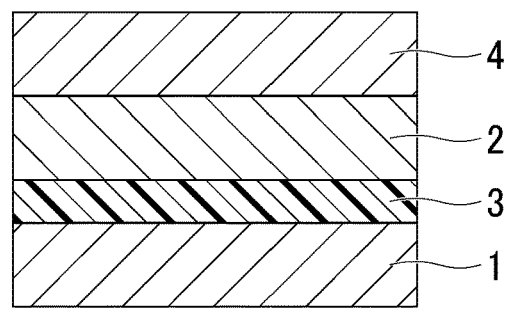
FIG. 4 is a cross-sectional view of a magnetoresistive effect element according to a first modification example.

FIG. 4 is a cross-sectional view of a magnetoresistive effect element 15 according to a first modification example. The magnetoresistive effect element 15 is different from the magnetoresistive effect element 10 in that the magnetoresistive effect element 15 further includes a third ferromagnetic layer 4. The third ferromagnetic layer 4 is in contact with a surface on a side opposite to a surface of a Heusler alloy layer which faces the nonmagnetic layer 3. FIG. 4 is an example of a case where the second ferromagnetic layer 2 is a Heusler alloy layer, and the third ferromagnetic layer 4 is provided on a surface on a side opposite to a surface of the second ferromagnetic layer 2 which faces the nonmagnetic layer 3. Further, in a case where the first ferromagnetic layer 1 is a Heusler alloy layer, the third ferromagnetic layer 4 is provided on a side opposite to a surface of the first ferromagnetic layer 1 which faces the nonmagnetic layer 3.

The third ferromagnetic layer 4 is a Co—Fe—B-A alloy. Co—Fe—B-A may be an alloy containing cobalt, iron, boron, and an A element, and the composition ratio of each of the elements does not matter. The A element is any one or more elements selected from the group consisting of Ti, V, Cr, Cu, Zn, Zr, Mo, Ru, Pd, Ta, W, Ir, Pt, and Au. The A element may be infiltrated into a crystal structure of CoFeB or may be substituted for any one element of crystals of CoFeB. The A element is preferably any one element selected from the group consisting of Ti, Ru, and Ta, and is particularly preferably Ta.

The Co—Fe—B-A alloy is an amorphous alloy at the time of film formation. The Co—Fe—B-A alloy is partially crystallized by annealing after the film formation, but contains an amorphous region. The third ferromagnetic layer 4 including an amorphous region is in contact with a Heusler alloy layer, and thus magneto-striction in the entire magnetoresistive effect element 15 is further suppressed.

At least a portion of a crystallized region (hereinafter referred to as a crystal region) in the third ferromagnetic layer 4 is lattice-matched with, for example, a crystal region of a Heusler alloy layer. The lattice-matching means that atoms are continuously arrayed in a lamination direction at an interface of a different layer. The degree of lattice-matching at the interface of the different layer is, for example, equal to or less than 5%. The degree of lattice-matching is the degree of deviation of a lattice constant of one layer based on a lattice constant of the other layer. When the third ferromagnetic layer 4 and the Heusler alloy layer are lattice-matched with each other, electron scattering at an interface is reduced, and thus it is possible to lower parasitic resistance of the magnetoresistive effect element 15.

In addition, the A element has a property of attracting boron. In the A element, Ti, Ru, and Ta particularly have a strong property of attracting boron. When the third ferromagnetic layer 4 contains the A element, diffusion of boron contained in the third ferromagnetic layer 4 to the Heusler alloy layer is suppressed during annealing.

Figure 5:
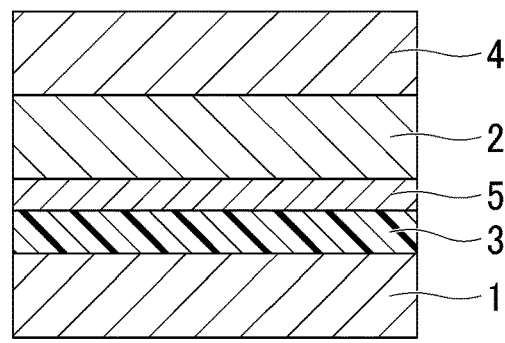
FIG. 5 is a cross-sectional view of a magnetoresistive effect element according to a second modification example.

FIG. 5 is a cross-sectional view of a magnetoresistive effect element 16 according to a second modification example. The magnetoresistive effect element 16 is different from the magnetoresistive effect element 15 in that the magnetoresistive effect element 16 further includes a fourth ferromagnetic layer 5. The fourth ferromagnetic layer 5 is in contact with a surface of a Heusler alloy layer which faces the nonmagnetic layer 3. FIG. 5 is an example of a case where the second ferromagnetic layer 2 is a Heusler alloy layer, and the fourth ferromagnetic layer 5 is provided between the second ferromagnetic layer 2 and the nonmagnetic layer 3. Further, in a case where the first ferromagnetic layer 1 is a Heusler alloy layer, the fourth ferromagnetic layer 5 is provided between the first ferromagnetic layer 1 and the nonmagnetic layer 3.

The fourth ferromagnetic layer 5 contains a Co—Fe—B-A alloy and is formed of the same material as that of the third ferromagnetic layer 4. The fourth ferromagnetic layer 5 increases an interface resistance between the Heusler alloy layer and the nonmagnetic layer 3 and increases an MR ratio of the magnetoresistive effect element 16. A film thickness of the fourth ferromagnetic layer 5 is, for example, equal to or less than a spin diffusion length of a material constituting the fourth ferromagnetic layer 5. An MR ratio of the magnetoresistive effect element 16 is determined depending on a relative angle between magnetizations of two ferromagnetic layers having the nonmagnetic layer 3 interposed therebetween. When the film thickness of the fourth ferromagnetic layer 5 is thick, the fourth ferromagnetic layer 5 greatly contributing to the MR ratio of the magnetoresistive effect element 16. On the other hands, when the film thickness of the fourth ferromagnetic layer 5 is sufficiently thin, the influence of the fourth ferromagnetic layer 5 on the MR ratio of the magnetoresistive effect element 16 becomes small, and the second ferromagnetic layer 2 (Heusler alloy layer) having a high spin polarizability greatly contributing to the MR ratio of the magnetoresistive effect element 16.

Figure 6:
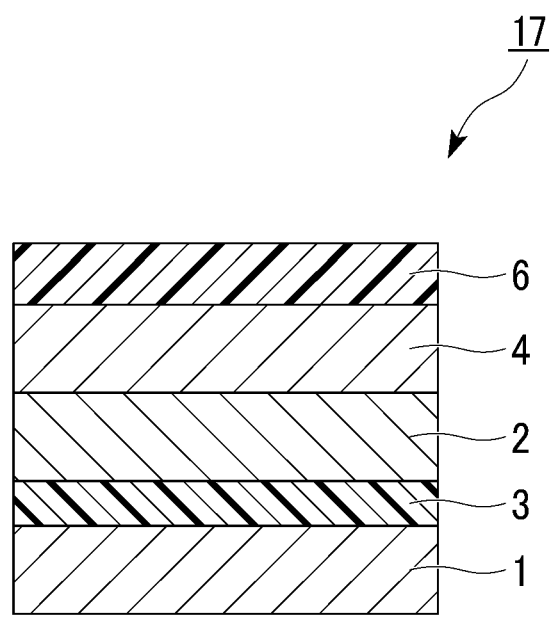
FIG. 6 is a cross-sectional view of a magnetoresistive effect element according to a third modification example.

FIG. 6 is a cross-sectional view of a magnetoresistive effect element 17 according to a third modification example. The magnetoresistive effect element 17 is different from the magnetoresistive effect element 15 in that the magnetoresistive effect element 17 further includes a second nonmagnetic layer 6. The second nonmagnetic layer 6 is in contact with a surface of the third ferromagnetic layer 4 on a side opposite to a surface of the third ferromagnetic layer 4 which faces the Heusler alloy layer. FIG. 6 is an example of a case where the second ferromagnetic layer 2 is a Heusler alloy layer, and the second nonmagnetic layer 6 is provided on a surface of the third ferromagnetic layer 4 on a side opposite to the second ferromagnetic layer 2.

The second nonmagnetic layer 6 contains boron and any one element selected from the group consisting of Ti, V, Cr, Cu, Zn, Zr, Mo, Ru, Pd, Ta, W, Ir, Pt, and Au. Ti, V, Cr, Cu, Zn, Zr, Mo, Ru, Pd, Ta, W, Ir, Pt, and Au are the same as the above-described A elements. Here, the A elements contained in the second nonmagnetic layer 6 and the A elements contained in the third ferromagnetic layer 4 are not necessarily the same as each other.

The second nonmagnetic layer 6 is, for example, a nonmagnetic metal. The second nonmagnetic layer 6 is, for example, a layer formed by adding boron to a metal or an alloy constituted by the A elements. The second nonmagnetic layer 6 is preferably any one element selected from the group consisting of Ti, Ru, and Ta among the A elements. The second nonmagnetic layer 6 is, for example, a layer obtained by adding boron or carbon to a metal or an alloy containing any one element selected from the group consisting of Ti, Ru, and Ta.

The second nonmagnetic layer 6 does not contain, for example, boron during a film formation process. That is, the second nonmagnetic layer 6 before an annealing process is, for example, a metal or an alloy of the A element. As described above, the A element has a property of attracting boron. The second nonmagnetic layer 6 contains boron because the A element attracts boron at the time of annealing.

The second nonmagnetic layer 6 suppresses diffusion of boron to the Heusler alloy layer (for example, the second ferromagnetic layer 2) and the nonmagnetic layer 3 at the time of annealing. When the Heusler alloy layer contains boron, the crystallinity of the Heusler alloy layer deteriorates, and an MR ratio of the magnetoresistive effect element 17 is decreased. In addition, when the nonmagnetic layer 3 contains boron, the crystallinity of the nonmagnetic layer 3 deteriorates, and an MR ratio of the magnetoresistive effect element 17 is decreased. That is, the second nonmagnetic layer 6 prevents boron contained in the third ferromagnetic layer 4 from being diffused to the Heusler alloy layer and the nonmagnetic layer 3 and suppresses a decrease in the MR ratio of the magnetoresistive effect element 17.

The configurations (the third ferromagnetic layer 4, the fourth ferromagnetic layer 5, and the second nonmagnetic layer 6) of the first to third modification examples may be used independently or may be used in combination. Further, in a case where each of the first ferromagnetic layer 1 and the second ferromagnetic layer 2 includes a Heusler alloy layer, each of the layers may be configured as two or more layers.

The magnetoresistive effect elements 10, 15, 16, and 17 described above can be used for various uses. The magnetoresistive effect elements 10, 15, 16, and 17 can be applied to, for example, a magnetic head, a magnetic sensor, a magnetic memory, a high-frequency filter, and the like.

Next, application examples of the magnetoresistive effect element according to the present embodiment will be described. Meanwhile, in the following application examples, the magnetoresistive effect element 10 is used as a magnetoresistive effect element, but the magnetoresistive effect element is not limited thereto.

Figure 7:
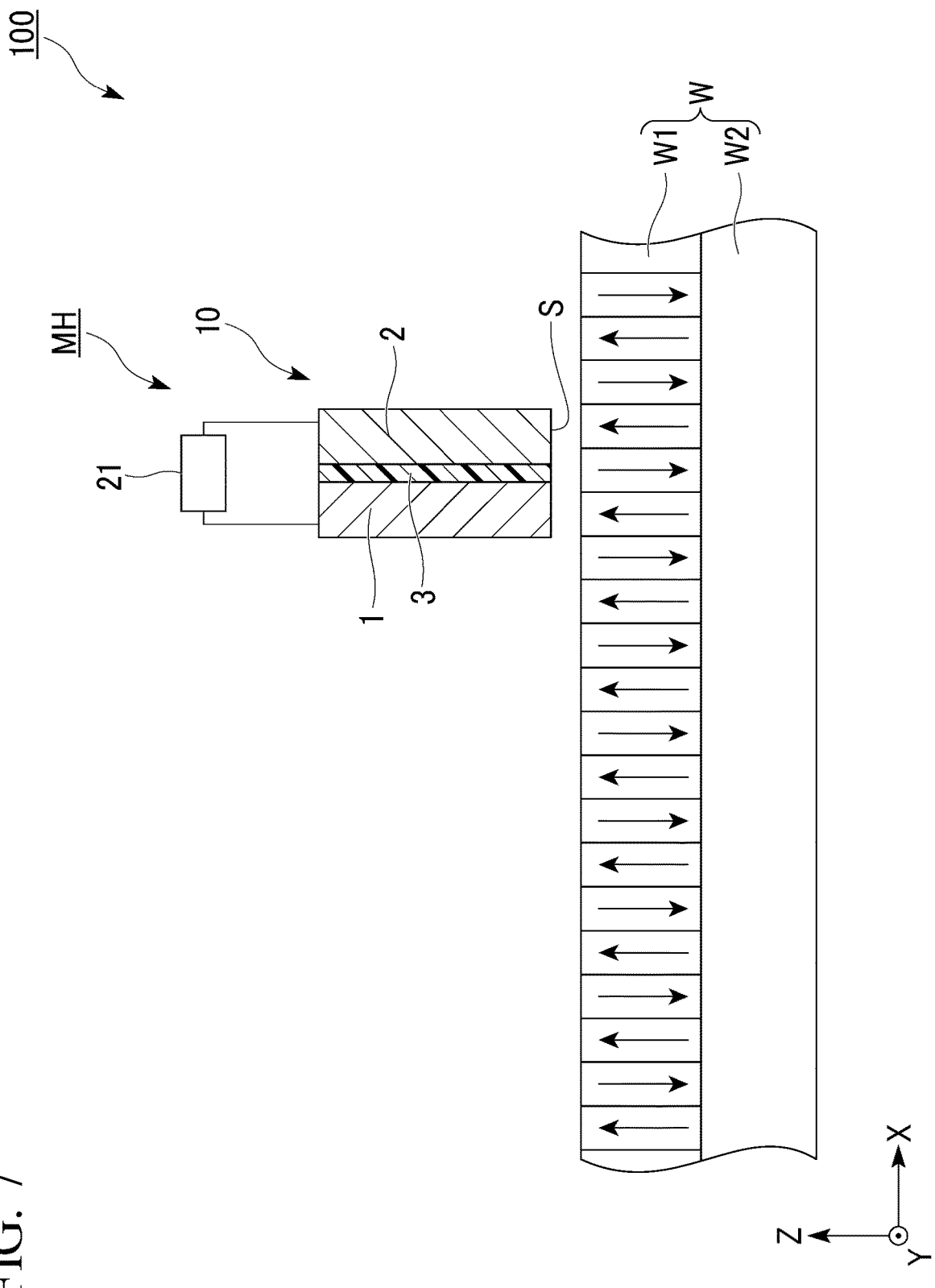
FIG. 7 is a cross-sectional view of a magnetic recording element according to Application Example 1.

FIG. 7 is a cross-sectional view of a magnetic recording element 100 according to Application Example 1. FIG. 7 is a cross-sectional view of the magnetoresistive effect element 10 which is cut off in a lamination direction.

As illustrated in FIG. 7, the magnetic recording element 100 includes a magnetic head MH and a magnetic recording medium W. In FIG. 7, one direction in which the magnetic recording medium W extends is set to be an X direction, and a direction perpendicular to the X direction is set to be a Y direction. An XY plane is parallel to a principal plane of the magnetic recording medium W. A direction connecting the magnetic recording medium W and the magnetic head MH and perpendicular to the XY plane is set to be a Z direction.

In the magnetic head MH, an air-bearing surface (medium facing surface) S faces the surface of the magnetic recording medium W. The magnetic head MH is moved in directions of an arrow +X and an arrow −X along the surface of the magnetic recording medium W at a position distant from the magnetic recording medium W at a fixed distance. The magnetic head MH includes the magnetoresistive effect element 10 acting as a magnetic sensor and a magnetic recording unit (not shown). The resistance measurement device 21 measures a resistance value in a lamination direction of the magnetoresistive effect element 10.

The magnetic recording unit applies a magnetic field to a recording layer W1 of the magnetic recording medium W and determines the direction of magnetization of the recording layer W1. That is, the magnetic recording unit performs magnetic recording of the magnetic recording medium W. The magnetoresistive effect element 10 reads information of magnetization of the recording layer W1 which is written by the magnetic recording unit.

The magnetic recording medium W includes the recording layer W1 and a backing layer W2. The recording layer W1 is a portion for performing magnetic recording, and the backing layer W2 is a magnetic path (a passage of magnetic flux) for recirculating magnetic flux for writing to the magnetic head MH again. The recording layer W1 records magnetic information as the direction of magnetization.

The second ferromagnetic layer 2 of the magnetoresistive effect element 10 is, for example, a magnetization free layer. For this reason, the second ferromagnetic layer 2 exposed to the air-bearing surface S is affected by magnetization recorded in the recording layer W1 of the magnetic recording medium W on an opposite side. For example, in FIG. 7, the direction of magnetization of the second ferromagnetic layer 2 is directed in a +Z direction due to the influence of magnetization directed in the +Z direction of the recording layer W1. In this case, the first ferromagnetic layer 1 which is a magnetization fixed layer and the direction of magnetization of the second ferromagnetic layer 2 are parallel to each other.

Here, resistance in a case where the first ferromagnetic layer 1 and the direction of magnetization of the second ferromagnetic layer 2 are in parallel with each other is different from resistance in a case where the first ferromagnetic layer 1 and the direction of magnetization of the second ferromagnetic layer 2 are antiparallel with each other. As a difference between a resistance value in the case of parallel and a resistance value in the case of antiparallel increases, an MR ratio of the magnetoresistive effect element 10 becomes larger. The magnetoresistive effect element 10 according to the present embodiment contains a crystallized Heusler alloy and has a large MR ratio. Therefore, information of magnetization of the recording layer W1 can be accurately read as a resistance value change by the resistance measurement device 21.

The shape of the magnetoresistive effect element 10 of the magnetic head MH is not particularly limited. For example, in order to avoid the influence of leakage magnetic field of the magnetic recording medium W on the first ferromagnetic layer 1 of the magnetoresistive effect element 10, the first ferromagnetic layer 1 may be located at a position distant from the magnetic recording medium W.

Figure 8:
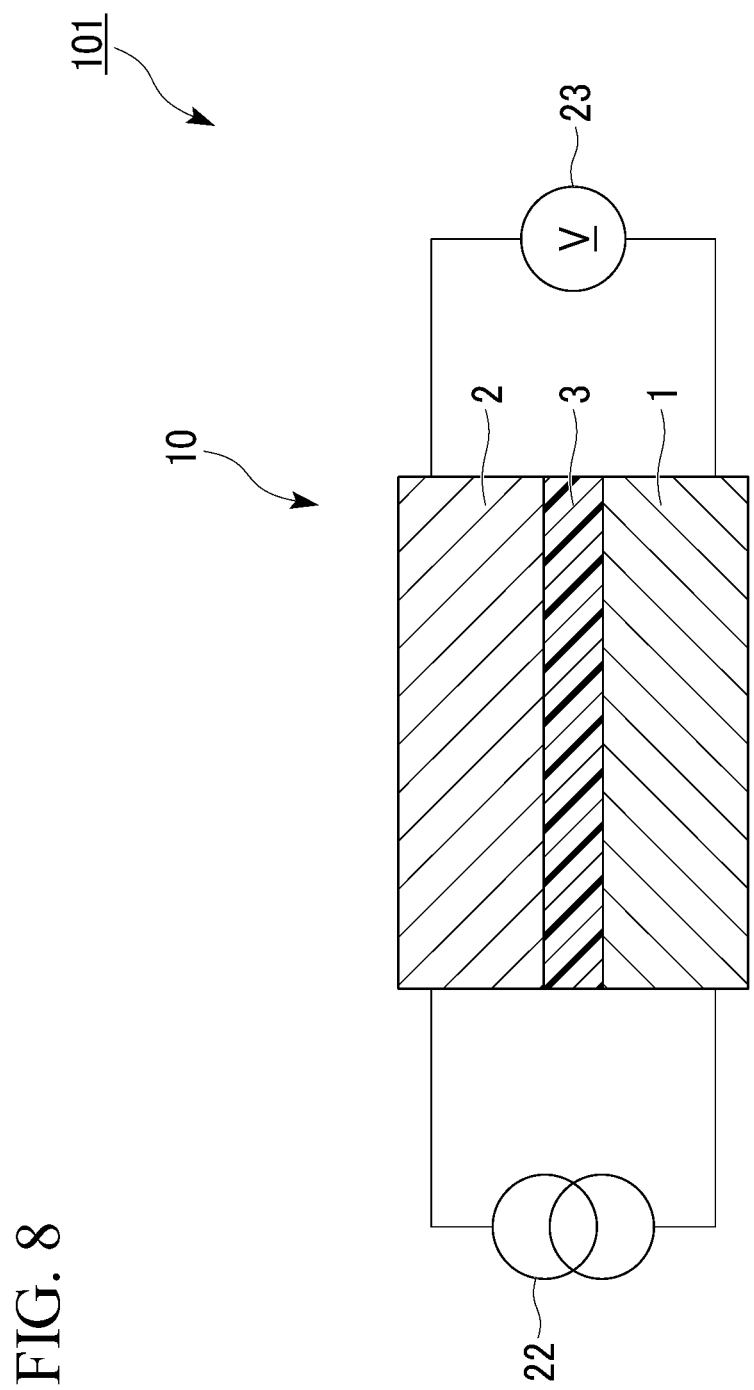
FIG. 8 is a cross-sectional view of a magnetic recording element according to Application Example 2.

FIG. 8 is a cross-sectional view of a magnetic recording element 101 according to Application Example 2. FIG. 8 is a cross-sectional view of the magnetic recording element 101 which is cut off in a lamination direction.

As illustrated in FIG. 8, the magnetic recording element 101 includes a magnetoresistive effect element 10, a power supply 22, and a measurement unit 23. The power supply 22 imparts a potential difference in the lamination direction of the magnetoresistive effect element 10. The power supply 22 is, for example, a direct current power supply. The measurement unit 23 measures a resistance value in the lamination direction of the magnetoresistive effect element 10.

When a potential difference is generated between a first ferromagnetic layer 1 and a second ferromagnetic layer 2 by the power supply 22, a current flows in the lamination direction of the magnetoresistive effect element 10. The current is spin-polarized when passing through the first ferromagnetic layer 1 to become a spin-polarized current. The spin-polarized current reaches the second ferromagnetic layer 2 through a nonmagnetic layer 3. The magnetization of the second ferromagnetic layer 2 is reversed by receiving a spin-transfer torque (STT) due to the spin-polarized current. A relative angle between the direction of magnetization of the first ferromagnetic layer 1 and the direction of magnetization of the second ferromagnetic layer 2 changes, and thus a resistance value in the lamination direction of the magnetoresistive effect element 10 changes. The resistance value in the lamination direction of the magnetoresistive effect element 10 is read by the measurement unit 23. That is, the magnetic recording element 101 illustrated in FIG. 8 is a spin-transfer torque (STT) type magnetic recording element.

The magnetic recording element 101 illustrated in FIG. 8 has excellent data stability because the second ferromagnetic layer 2 contains an amorphous Heusler alloy and has reduced magneto-striction.

Figure 9:
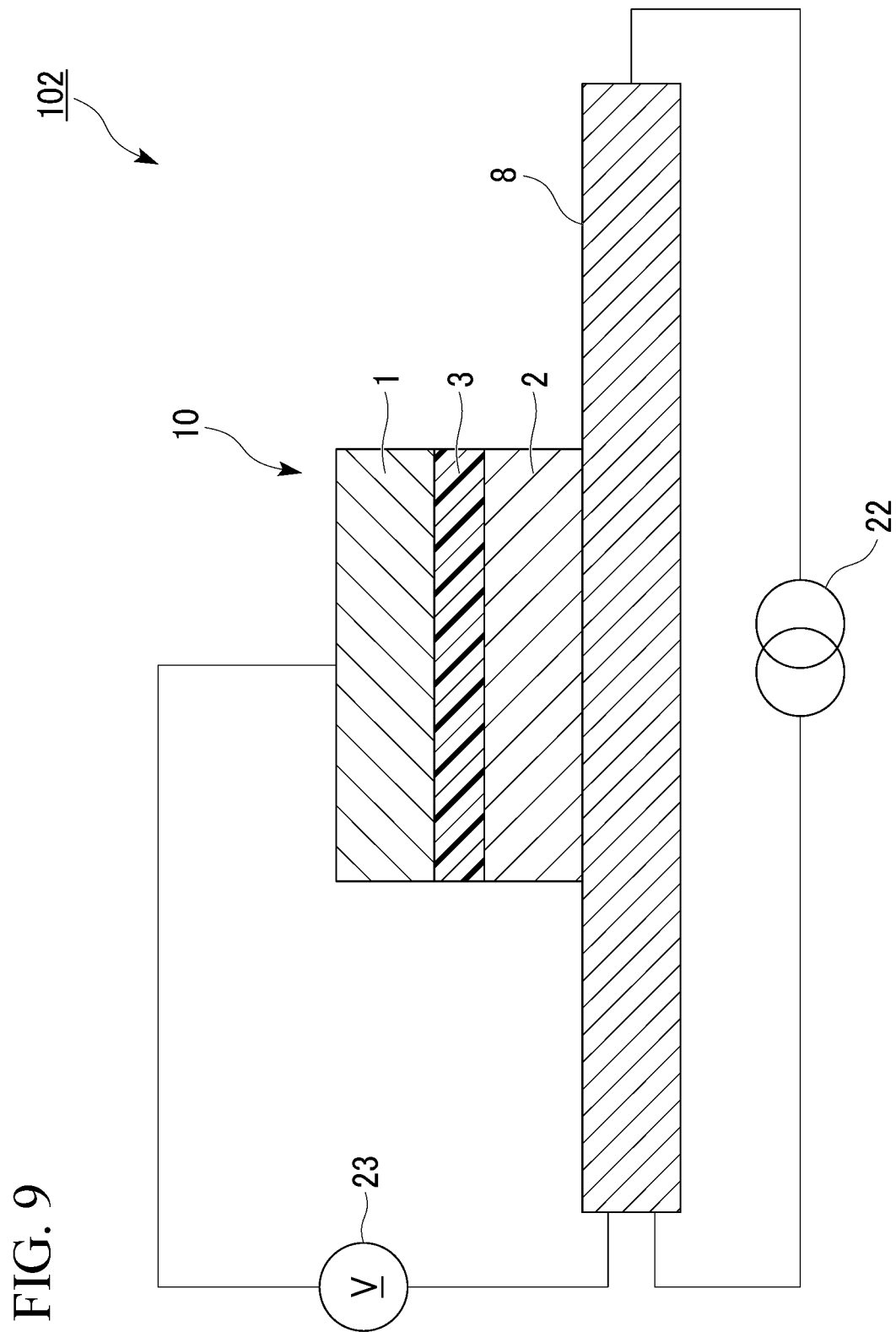
FIG. 9 is a cross-sectional view of a magnetic recording element according to Application Example 3.

FIG. 9 is a cross-sectional view of a magnetic recording element 102 according to Application Example 3. FIG. 9 is a cross-sectional view of the magnetic recording element 102 which is cut off in a lamination direction.

As illustrated in FIG. 9, the magnetic recording element 102 includes a magnetoresistive effect element 10, a spin-orbit torque wiring 8, a power supply 22, and a measurement unit 23. The spin-orbit torque wiring 8 is in contact with, for example, a second ferromagnetic layer 2. The spin-orbit torque wiring 8 extends in one direction in an in-plane direction. The power supply 22 is connected to a first end and a second end of the spin-orbit torque wiring 8. The magnetoresistive effect element 10 is interposed between the first end and the second end when seen in plan view. The power supply 22 applies a writing current along the spin-orbit torque wiring 8. The measurement unit 23 measures a resistance value in the lamination direction of the magnetoresistive effect element 10.

When a potential difference is generated between the first end and the second end of the spin-orbit torque wiring 8 by the power supply 22, a current flows in the in-plane direction of the spin-orbit torque wiring 8. The spin-orbit torque wiring 8 has a function of generating a spin flow by a spin hole effect when a current flows. The spin-orbit torque wiring 8 contains, for example, any one of a metal, an alloy, an intermetallic compound, metal boride, metal carbide, metal silicide, and metal phosphide which have a function of generating a spin flow by a spin hole effect when a current flows. For example, the wiring includes a non-magnetic metal having an atomic number of 39 or greater having d electrons or f electrons in the outermost portion thereof.

When a current flows in the in-plane direction of the spin-orbit torque wiring 8, a spin hole effect is generated by spin-orbit interaction. The spin hole effect is a phenomenon in which a moving spin is bent in a direction orthogonal to a current flow direction. The spin hole effect generates uneven distribution of spins in the spin-orbit torque wiring 8 and induces a spin flow in the thickness direction of the spin-orbit torque wiring 8. A spin is injected into the second ferromagnetic layer 2 from the spin-orbit torque wiring 8 due to a spin flow.

A spin injected into the second ferromagnetic layer 2 imparts a spin-orbit torque (SOT) to the magnetization of the second ferromagnetic layer 2. The magnetization of the second ferromagnetic layer 2 is reversed by receiving the spin-orbit torque (SOT). A relative angle between the direction of the magnetization of the first ferromagnetic layer 1 and the direction of the magnetization of the second ferromagnetic layer 2 changes, and thus a resistance value in the lamination direction of the magnetoresistive effect element 10 changes. The resistance value in the lamination direction of the magnetoresistive effect element 10 is read by the measurement unit 23. That is, the magnetic recording element 102 illustrated in FIG. 9 is a spin-orbit torque (SOT) type magnetic recording element.

The magnetic recording element 102 illustrated in FIG. 9 has excellent data stability because the second ferromagnetic layer 2 contains an amorphous Heusler alloy and has reduced magneto-striction.

Figure 10:
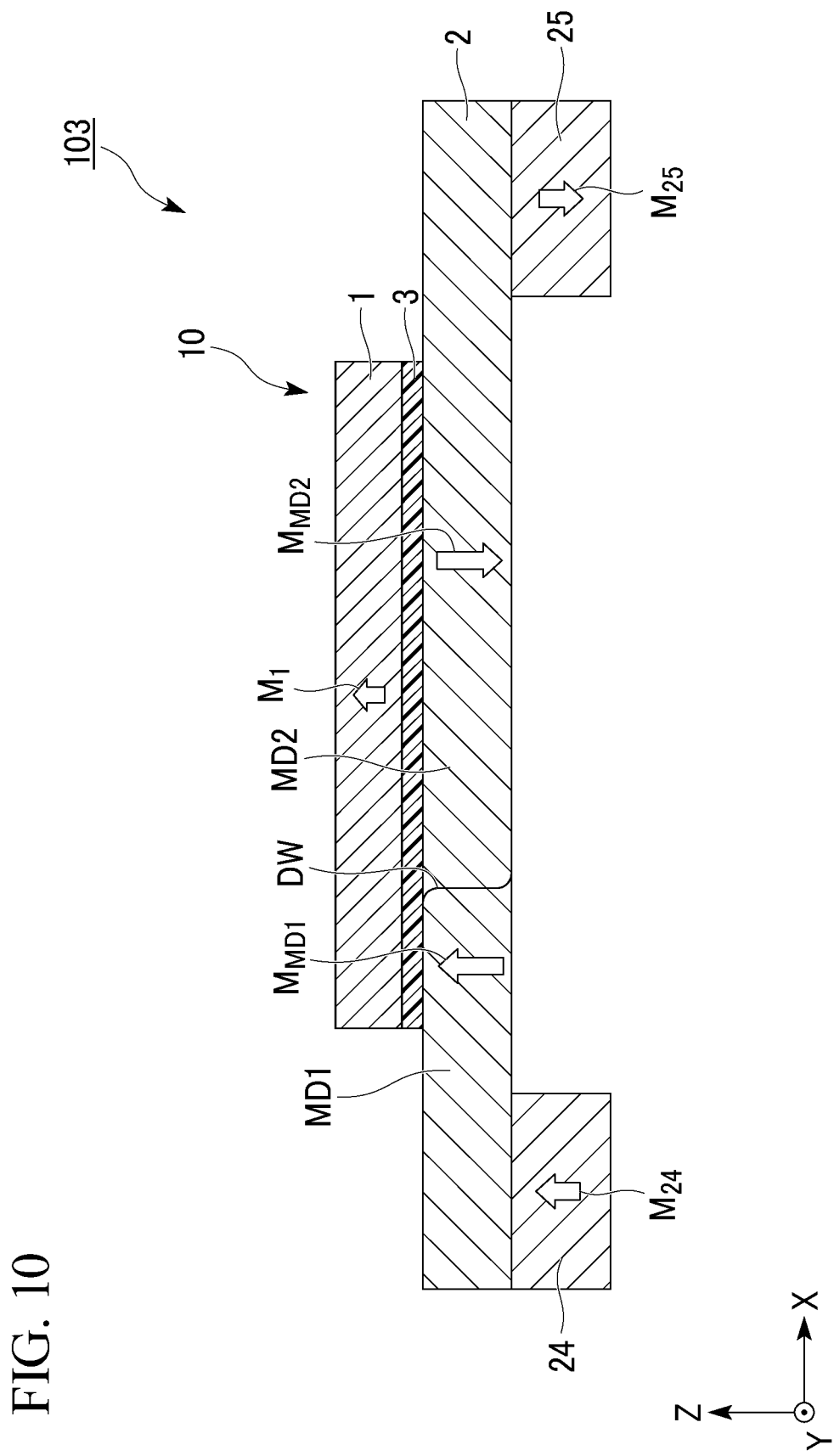
FIG. 10 is a cross-sectional view of a magnetic domain wall moving element according to Application Example 4.

FIG. 10 is a cross-sectional view of a magnetic domain wall moving element (magnetic domain wall movement type magnetic recording element) according to Application Example 4. A magnetic domain wall moving element 103 includes a magnetoresistive effect element 10, a first magnetization fixed layer 24, and a second magnetization fixed layer 25. The magnetoresistive effect element 10 includes a first ferromagnetic layer 1, a second ferromagnetic layer 2, and a nonmagnetic layer 3. In FIG. 10, a direction in which the second ferromagnetic layer 2 extends is set to be an X direction, a direction perpendicular to the X direction is set to be a Y direction, and a direction perpendicular to an XY plane is set to be a Z direction.

A first magnetization fixed layer 24 and a second magnetization fixed layer 25 are connected to a first end or a second end of the second ferromagnetic layer 2, respectively. The first ferromagnetic layer 1 and the nonmagnetic layer 3 are interposed between the first end and the second end in the X direction.

The second ferromagnetic layer 2 is a layer in which information can be magnetically recorded due to a change in an internal magnetic state. The second ferromagnetic layer 2 includes a first magnetic domain MD1 and a second magnetic domain MD2 therein. Magnetization at a position where the second ferromagnetic layer 2 overlaps the first magnetization fixed layer 24 or the second magnetization fixed layer 25 in the second ferromagnetic layer 2 in the Z direction is fixed in one direction. Magnetization at a position which overlaps the first magnetization fixed layer 24 in the Z direction is fixed in, for example, a +Z direction, and magnetization at a position which overlaps the second magnetization fixed layer 25 in the Z direction is fixed in, for example, a −Z direction. As a result, a magnetic domain wall DW is formed at a boundary between the first magnetic domain MD1 and the second magnetic domain MD2. The second ferromagnetic layer 2 can include the magnetic domain wall DW therein. In the second ferromagnetic layer 2 illustrated in FIG. 10, magnetization $M_{MD1}$ of the first magnetic domain MD1 is oriented in the +Z direction, and magnetization $M_{MD2}$ of the second magnetic domain MD2 is oriented in the −Z direction.

The magnetic domain wall moving element 103 can record data in multiple values or continuously depending on the position of the magnetic domain wall DW of the second ferromagnetic layer 2. The data recorded in the second ferromagnetic layer 2 is read as a resistance value change of the magnetic domain wall moving element 103 at the time of applying a read current.

The proportions of the first magnetic domain MD1 and the second magnetic domain MD2 in the second ferromagnetic layer 2 change when the magnetic domain wall DW is moved. The direction of magnetization of the first ferromagnetic layer 1 $M_1$ is the same as (parallel to), for example, the direction of the magnetization $M_{MD1}$ of the first magnetic domain MD1 and is opposite to (antiparallel with) the direction of the magnetization $M_{MD2}$ of the second magnetic domain MD2. When the magnetic domain wall DW is moved in the +X direction and the area of the first magnetic domain MD1 in a portion superimposed on the first ferromagnetic layer 1 when seen in plan view from the Z direction is increased, a resistance value of the magnetic domain wall moving element 103 is decreased. In contrast, when the magnetic domain wall DW is moved in the −X direction and the area of the second magnetic domain MD2 in a portion superimposed on the first ferromagnetic layer 1 when seen in plan view from the Z direction is increased, a resistance value of the magnetic domain wall moving element 103 is increased.

The magnetic domain wall DW is moved by applying a writing current in the X direction of the second ferromagnetic layer 2 or applying an external magnetic field. For example, when a wiring current (for example, a current pulse) is applied in the +X direction of the second ferromagnetic layer 2, electrons flow in the −X direction opposite to that of the current, and thus the magnetic domain wall DW is moved in the −X direction. In a case where a current flows toward the second magnetic domain MD2 from the first magnetic domain MD1, electrons spin-polarized in the second magnetic domain MD2 reverse the magnetization $M_{MD1}$ of the first magnetic domain MD1. The magnetization $M_{MD1}$ of the first magnetic domain MD1 is reversed, and thus the magnetic domain wall DW is moved in the −X direction.

The magnetic domain wall moving element 103 illustrated in FIG. 10 has excellent data stability because the second ferromagnetic layer 2 contains an amorphous Heusler alloy and has reduced magneto-striction.

Figure 11:
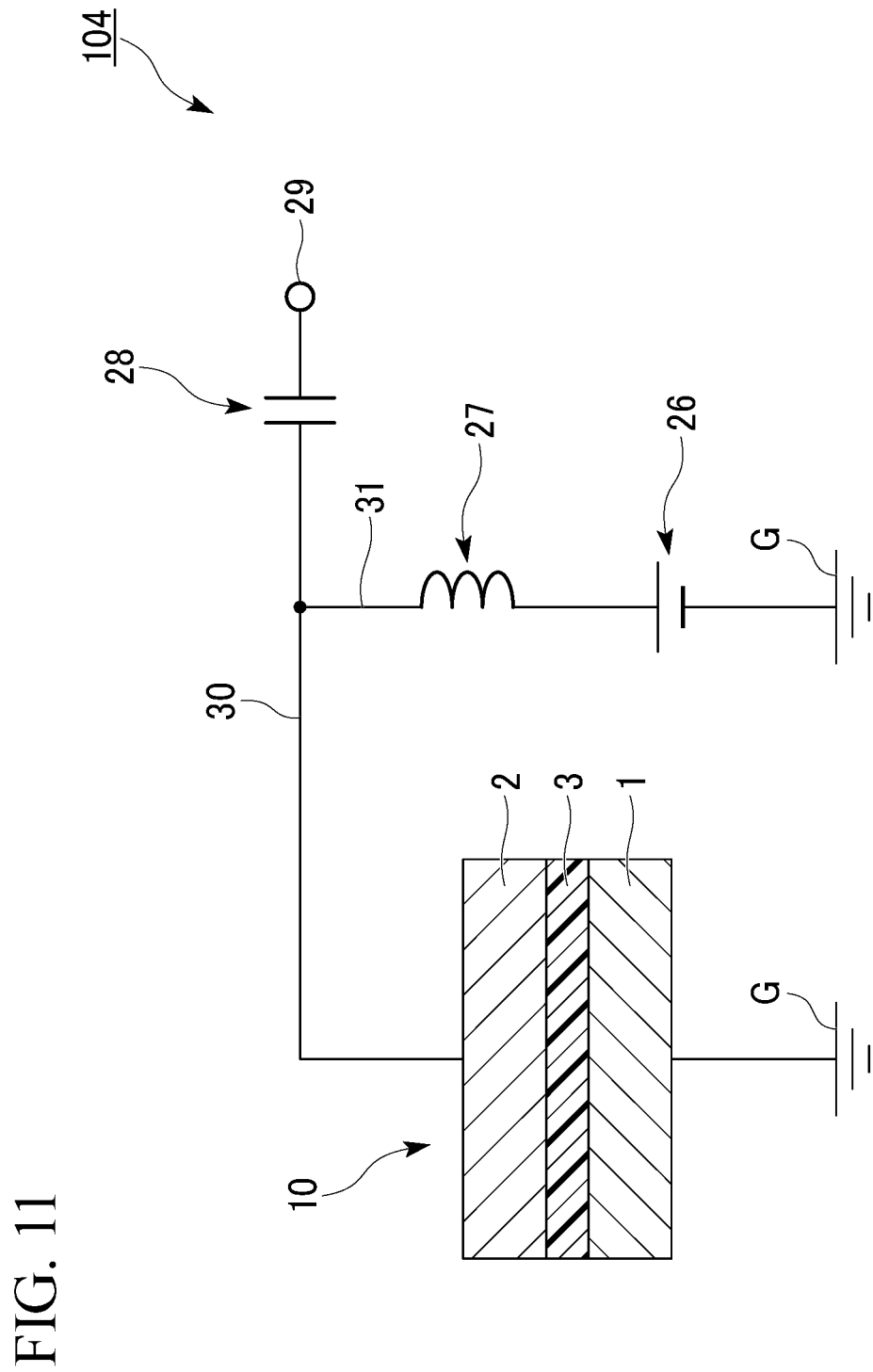
FIG. 11 is a cross-sectional view of a high-frequency device according to Application Example 5.

FIG. 11 is a schematic diagram of a high-frequency device 104 according to Application Example 5. As illustrated in FIG. 11, the high-frequency device 104 includes a magnetoresistive effect element 10, a direct current power supply 26, an inductor 27, a capacitor 28, an output port 29, and wirings 30 and 31.

The wiring 30 connects the magnetoresistive effect element 10 and the output port 29. The wiring 31 branches out from the wiring 30 and reaches a ground G through the inductor 27 and the direct current power supply 26. Known devices can be used as the direct current power supply 26, the inductor 27, and the capacitor 28. The inductor 27 cuts a high-frequency component of a current and transmits an invariable component of the current. The capacitor 28 transmits a high-frequency component of a current and cuts an invariable component of the current. The inductor 27 is disposed in a portion where a flow of a high-frequency current is desired to be suppressed, and the capacitor 28 is disposed in a portion where a flow of a direct current is desired to be suppressed.

When an alternating current or an AC magnetic field is applied to a ferromagnetic layer included in the magnetoresistive effect element 10, the magnetization of the second ferromagnetic layer 2 precesses. The magnetization of the second ferromagnetic layer 2 vibrates strongly when a frequency of a high-frequency current or a high-frequency magnetic field applied to the second ferromagnetic layer 2 is close to a ferromagnetic resonance frequency of the second ferromagnetic layer 2, and does not vibrate much at a frequency which is far from the ferromagnetic resonance frequency of the second ferromagnetic layer 2. This phenomenon is referred to as a ferromagnetic resonance phenomenon.

A resistance value of the magnetoresistive effect element 10 changes depending on the vibration of the magnetization of the second ferromagnetic layer 2. The direct current power supply 26 applies a direct current to the magnetoresistive effect element 10. The direct current flows in the lamination direction of the magnetoresistive effect element 10. The direct current flows to the ground G through the wirings 30 and 31 and the magnetoresistive effect element 10. The potential of the magnetoresistive effect element 10 changes according to Ohm's law. A high-frequency signal is output from the output port 29 in response to a change in the potential of the magnetoresistive effect element 10 (a change in a resistance value).

The high-frequency device 104 illustrated in FIG. 11 has little noise and can transmit a high-frequency signal having a specific frequency because the second ferromagnetic layer 2 contains an amorphous Heusler alloy and has reduced magneto-striction.

EXPLANATION OF REFERENCES

1 First ferromagnetic layer
1a, 2a First surface
1b, 2b Second surface
2 Second ferromagnetic layer
3, 13 Nonmagnetic layer
4 Third ferromagnetic layer
5 Fourth ferromagnetic layer
6 Second nonmagnetic layer
8 Spin-orbit torque wiring
10, 15, 16, 17 Magnetoresistive effect element
11, 12A, 12B Ferromagnetic layer
21 Resistance measurement device
22 Power supply
23 Measurement unit
24 First magnetization fixed layer
25 Second magnetization fixed layer
26 Direct current power supply
27 Inductor
28 Capacitor
29 Output port
30, 31 Wiring
100, 101, 102 Magnetic recording element
103 Magnetic domain wall moving element
104 High-frequency device
DW Magnetic domain wall
MD1 First magnetic domain MD2 Second magnetic domain
Sub Substrate

What is claimed is:

1. A magnetoresistive effect element, comprising:
a first ferromagnetic layer;
a second ferromagnetic layer; and
a nonmagnetic layer positioned between the first ferromagnetic layer and the second ferromagnetic layer,
wherein at least one of the first ferromagnetic layer and the second ferromagnetic layer includes a Heusler alloy layer including a crystal region and an amorphous region,
a Heusler alloy constituting the Heusler allow layer is represented by $Co_2Y_\alpha Z_\beta$,
Y is one or more elements selected from the group consisting of Fe, Mn, and Cr,
Z is one or more elements selected from the group consisting of Si, Al, Ga, and Ge, and
$\alpha+\beta>2$ is satisfied.

2. The magnetoresistive effect element according to claim 1, wherein the Heusler alloy layer includes the crystal region and the amorphous region mixed together.

3. The magnetoresistive effect element according to claim 1, wherein a proportion of the crystal region is higher than a proportion of the amorphous region at a first interface in the Heusler alloy layer which is in contact with the nonmagnetic layer.

4. The magnetoresistive effect element according to claim 1, wherein the first interface in the Heusler alloy layer which is in contact with the nonmagnetic layer is the crystal region.

5. The magnetoresistive effect element according to claim 1, wherein
the first ferromagnetic layer is a magnetization fixed layer,
the second ferromagnetic layer is a magnetization free layer, and
the second ferromagnetic layer includes the Heusler alloy layer.

6. The magnetoresistive effect element according to claim 5, further comprising:
a substrate,
wherein the first ferromagnetic layer is positioned closer to the substrate than the second ferromagnetic layer.

7. The magnetoresistive effect element according to claim 1, wherein
the crystal region includes a plurality of crystal grains, and
a direction of a crystal axis of at least one crystal grain among the plurality of crystal grains is different from directions of crystal axes of any of the other crystal grains.

8. The magnetoresistive effect element according to claim 1, wherein a proportion of the crystal region at the first interface in the Heusler alloy layer which is in contact with the nonmagnetic layer is higher than that at a second interface on a side opposite to the first interface.

9. The magnetoresistive effect element according to claim 8, wherein a proportion of the crystal region decreases toward the second interface from the first interface.

10. The magnetoresistive effect element according to claim 1, further comprising:
a fourth ferromagnetic layer,
wherein the fourth ferromagnetic layer is positioned between the Heusler alloy layer and the nonmagnetic layer,
the fourth ferromagnetic layer includes a Co—Fe—B—A alloy, and
an A element included in the fourth ferromagnetic layer is any one or more elements selected from the group consisting of Ti, V, Cr, Cu, Zn, Zr, Mo, Ru, Pd, Ta, W, Ir, Pt, and Au.

11. The magnetoresistive effect element according to claim 10, wherein a film thickness of the fourth ferromagnetic layer is equal to or less than a spin diffusion length of a material constituting the fourth ferromagnetic layer.

12. A magnetoresistive effect element, comprising:
a first ferromagnetic layer;
a second ferromagnetic layer; and
a nonmagnetic layer positioned between the first ferromagnetic layer and the second ferromagnetic layer,
wherein the first ferromagnetic layer is a magnetization fixed layer,
the second ferromagnetic layer is a magnetization free layer,
both the first ferromagnetic layer and the second ferromagnetic layer include a Heusler alloy layer including a crystal region and an amorphous region, and
a proportion of the crystal region in the Heusler alloy layer in the first ferromagnetic layer is higher than that in the Heusler alloy layer in the second ferromagnetic layer.

13. The magnetoresistive effect element according to claim 12, wherein
a Heusler alloy constituting the Heusler alloy layer is represented by $Co_2Y_\alpha Z_\beta$,
Y is one or more kinds of elements selected from the group consisting of Fe, Mn, and Cr,
Z is one or more kinds of elements selected from the group consisting of Si, Al, Ga, and Ge, and
$\alpha+\beta>2$ is satisfied.

14. A magnetoresistive effect element, comprising:
a first ferromagnetic layer;
a second ferromagnetic layer;
a nonmagnetic layer positioned between the first ferromagnetic layer and the second ferromagnetic layer; and
a third ferromagnetic layer,
wherein at least one of the first ferromagnetic layer and the second ferromagnetic layer includes a Heusler alloy layer including a crystal region and an amorphous region,
wherein the third ferromagnetic layer is in contact with a surface on a side opposite to a surface of the Heusler alloy layer which faces the nonmagnetic layer,
the third ferromagnetic layer includes a Co—Fe—B—A alloy, and
an A element included in the third ferromagnetic layer is any one or more elements selected from the group consisting of Ti, V, Cr, Cu, Zn, Zr, Mo, Ru, Pd, Ta, W, Ir, Pt, and Au.

15. The magnetoresistive effect element according to claim 14, wherein
at least a portion of the third ferromagnetic layer is crystallized, and
at least a portion of a crystal region of the third ferromagnetic layer is lattice-matched with the crystal region of the Heusler alloy layer.

16. The magnetoresistive effect element according to claim 14, further comprising:
a second nonmagnetic layer,
wherein the second nonmagnetic layer is in contact with a surface on a side opposite to a surface of the third ferromagnetic layer which faces the nonmagnetic layer, and the second nonmagnetic layer includes B and any one element selected from the group consisting of Ti, V, Cr, Cu, Zn, Zr, Mo, Ru, Pd, Ta, W, Ir, Pt, and Au.

17. The magnetoresistive effect element according to claim 14, wherein
a Heusler alloy constituting the Heusler alloy layer is represented by $Co_2Y_\alpha Z_\beta$,
Y is one or more kinds of elements selected from the group consisting of Fe, Mn, and Cr,
Z is one or more kinds of elements selected from the group consisting of Si, Al, Ga, and Ge, and
$\alpha+\beta>2$ is satisfied.

* * * * *